United States Patent

Jaag

[15] 3,701,958

[45] Oct. 31, 1972

[54] MULTISECTION BANDPASS FILTER FROM SMALL SIGNAL CIRCUITS

[72] Inventor: Herbert Jaag, Villingen, Germany

[73] Assignee: SABA Schwarzwalder Apparate-Bau-Anstalt August Schwer Sohne GmbH, Villingen, Germany

[22] Filed: Dec. 18, 1970

[21] Appl. No.: 80,443

[30] Foreign Application Priority Data

Dec. 17, 1969 Germany..........P 69 48 645.9

[52] U.S. Cl..............333/70 S, 333/70 R, 333/84 M, 317/101 CM

[51] Int. Cl..........H03h 7/06, H03h 7/08, H05k 1/14

[58] Field of Search........333/70 S, 84 M, 70, 76, 77; 317/101 R, 101 A, 101 B, 101 C, 101 CM, 101 CW, 101 D

[56] References Cited

UNITED STATES PATENTS

| | | | |
|---|---|---|---|
| 2,832,935 | 4/1958 | Tank | 333/70 S X |
| 2,599,508 | 6/1952 | Allison | 333/70 S UX |
| 2,688,119 | 8/1954 | Gere | 333/70 R X |
| 2,786,984 | 3/1957 | Slate | 336/200 X |
| 2,911,605 | 11/1959 | Wales, Jr. | 336/232 X |
| 2,913,632 | 11/1959 | Stanton | 317/101 CM |
| 3,409,805 | 11/1968 | Whipple et al | 336/200 X |
| 3,569,872 | 3/1971 | Berlin | 317/101 CM X |
| 2,584,592 | 2/1952 | Kehbel | 333/76 X |

*Primary Examiner*—Herman Karl Saalbach
*Assistant Examiner*—Marvin Nussbaum
*Attorney*—Michael S. Striker

[57] ABSTRACT

Individual sections of the filter are printed on separate circuit boards, the rear faces of which are covered with a shielding layer. The boards are sandwiched together, separated by insulating plates, resulting pile forming the multisection filter.

8 Claims, 4 Drawing Figures

MULTISECTION BANDPASS FILTER FROM SMALL SIGNAL CIRCUITS

BACKGROUND OF THE INVENTION

The invention relates to a multisection bandpass filter for small signal circuits, such as those used in radios and television sets, the inductors and capacitors of the filter sections being printed on boards of electrically insulating material that are provided on both faces with an electrically conductive coating, or layer.

Filters are widely used in television engineering for intermediate frequency amplifiers that must allow a relatively wide frequency band to pass. For this purpose, bandpass filters are used that consist of several tuned resonant sections, successive sections being coupled together inductively or capacitively.

At the present time, bandpass filters are used composed of discrete coils, capacitors, and resistors, arranged under a shielding can. When aligning the filter, the required bandpass curve is obtained by changing the coupling and the inductance.

With the introduction of printed circuit techniques, bandpass filters have been simplified and are cheaper to manufacture, since the coil of each section can be applied in one operation with the wiring on a board of insulating material. These bandpass filters, however, require a relatively large amount of space because of their areal extension.

SUMMARY OF THE INVENTION

An object of the invention is an n section bandpass filter requiring but little space.

The invention consists essentially of *n* printed circuit boards, each board having on both faces an electrically conductive layer and each board having printed thereon one section of the multisection filter, said circuit boards being placed face-on-face so as to form a pile of *n* boards comprising a bandpass filter of n sections.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENT

Figure 1:
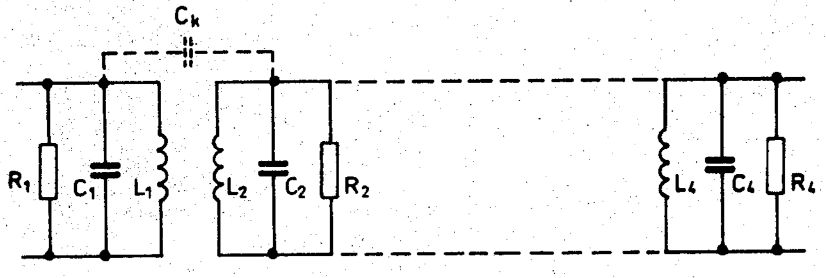
FIG. 1 is a schematic diagram of a four-section L, C, R filter.

As shown in FIG. 1, multisection filters, each section tuned and coupled to the next section, are used for passing a wide band of frequencies. The individual sections consist of the components R1, C1, and L1; R2, C2, and L2; . . . R4, C4, and L4. The filter, of course, can have *n* number of sections. Successive sections are coupled together inductively or capacitively. One of the printed circuit filter sections is shown in FIG. 2*a*. The components L, C, and R are deposited by any suitable way on the board P. One plate of a capacitor C of a filter section is formed by the grounded shielding layers S on the respective rear faces (see FIG. 2b) of two successive boards P. One end of the inductance L is connected to the capacitor plate shown in FIG. 2*a*, and the other end is connected by a through connector to the shielding layer S on the opposite face of the board P, this shielding layer, as just explained, forming the other plate of the capacitor C.

Figure 2:
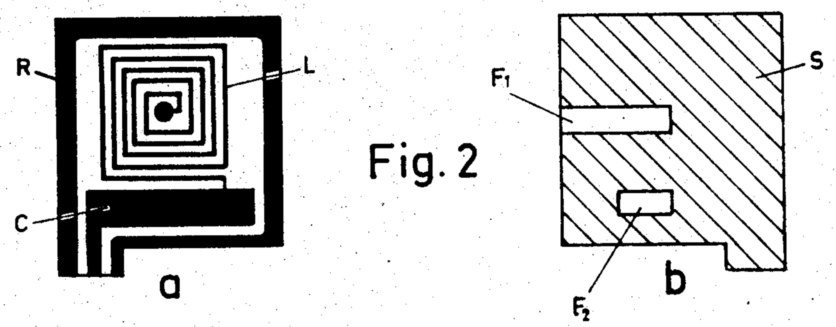
FIG. 2*a* is a plan view showing that face of the printed circuit board having the coil, resistor, and one plate of the capacitor of one filter section.
FIG. 2*b* is a plan view of the other face of a printed circuit board.
Figure 3:
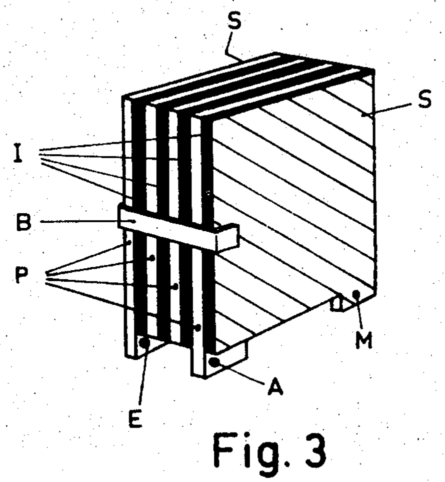
FIG. 3 shows an assembled filter of the invention.

FIG. 3 shows how the novel bandpass filter is composed of a pile of printed circuit boards P of the kind shown in FIG. 2. As many boards P, each having printed thereon one section of the filter, can be piled together as desired, successive boards being separated by an electrical insulating plate I, which provides a predetermined spacing between neighboring printed circuit boards P. Inductive coupling between successive sections is ensured by slots $F_1$ in the shielding layer S, the length and width of these slots being adjusted so that the desired coupling is obtained. If the dimensions of the slots are accurate, it is not necessary to trim the couplings after the filter is completely assembled. Capacitive coupling can be obtained by windows $F_2$ incorporated in the shielding layer S. For the different circuit boards P of the filter, the slots $F_1$ are staggered with respect to each other, as are the windows $F_2$.

In accordance with the invention, no shielding can is used for the pile shown in FIG. 3. Instead, one end of the pile is provided with a plate M entirely covered over one face with an electrically conductive layer S. As shown in FIG. 3, the shielding layer S of a printed circuit board P advantageously shields one or more sides of the pile. The individual resonant circuits (the sections) of the filter are shielded and damped by a shielding layer that surrounds the coil and capacitor of each section, this shielding layer for each section being connected to a common grounding lead.

For the completed filter, the signal input connection is at E, the signal output connection at A, and the common grounding connection for all of the boards P is at M. the common grounding connection is made to each of the boards P by means of a clasp B, for example.

The invention enables the construction, without subsequent tuning and without discrete components, of a very compact multisection bandpass filter that is especially suitable for integrated circuits.

It will be understood that each of the elements described above, or two or more together, may also find a useful application in other types of circuits differing from the types described above.

While the invention has been illustrated and described as embodied in multisection bandpass filter for small signal circuits, it is not intended to be limited to the details shown, since various modifications, structural and circuit changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. A multisection filter comprising, in combination, a plurality of stacked printed circuit boards, each printed circuit board having printed on one face thereof one section of the filter, and on the other face thereof being covered by a conductive shielding layer, said shielding layer being provided with at least one coupling slot for coupling electromagnetic energy therethrough; and a plurality of insulating plates arranged between pairs of adjacent printed circuit boards to separate the printed filter section of one printed circuit board from the conductive shielding layer of an adjacent printed circuit board, said slot being arranged in relation to two adjacent filter sections which are arranged on each side of the respective shielding layer so as to couple energy from one filter section to the adjoining filter section through said slot.

2. A filter as defined in claim 1, wherein said filter sections include inductance means on said one face of the respective printed circuit board, and wherein said slot in said shielding layer on said other face is at least partially directly behind said inductance means for permitting inductive coupling between adjacent successive sections of the filter.

3. A filter as defined in claim 1, wherein said filter sections include capacitor means on said one face of the respective printed circuit board, and wherein said slot in said shielding layer on said other face is at least partially directly behind said capacitor means for permitting capacitive coupling between successive sections of the filter.

4. A filter as defined in claim 1, wherein the filter section and the conductive shielding layer are both integral with the printed circuit board.

5. A filter as defined in claim 2, wherein the inductively coupling slots of the shielding layers are staggered.

6. A filter as defined in claim 3, wherein the capacitively coupling windows of the shielding layers are staggered.

7. A filter as defined in claim 1, wherein each printed filter section includes capacitor and inductor means, and further including a coating at reference potential and surrounding said capacitor and conductor means of each section for shielding and damping the latter.

8. A filter as defined in claim 1, wherein one end face of each printed circuit board has a shielding layer that is at reference potential, and one exposed face of said stack is formed by said shielding layer of the printed circuit board having the first section of the filter, and said stack further comprising an insulating plate having on one face thereof a shielding layer at reference potential, said insulating plate contacting the nth printed circuit board and said shielding layer of said plate forming the exposed other end face of said stack, whereby the shielding layer of the two exposed end faces compose a shield for the multi-section filter.

* * * * *